US010720461B2

(12) United States Patent
Fotopoulou et al.

(10) Patent No.: US 10,720,461 B2
(45) Date of Patent: Jul. 21, 2020

(54) DETECTOR DEVICE WITH MAJORITY CURRENT AND ISOLATION MEANS

(71) Applicant: Sony Depthsensing Solutions SA/NV, Brussels (BE)

(72) Inventors: Kyriaki Korina Fotopoulou, Brussels (BE); Ward Van Der Tempel, Muizen (BE); Daniel Van Nieuwenhove, Hofstade (BE)

(73) Assignee: Sony Depthsensing Solutions SA/NV, Brussels (BE)

( * ) Notice: Subject to any disclaimer, the term of this patent is extended or adjusted under 35 U.S.C. 154(b) by 74 days.

(21) Appl. No.: 16/070,456

(22) PCT Filed: Jan. 12, 2017

(86) PCT No.: PCT/EP2017/050541
§ 371 (c)(1),
(2) Date: Jul. 16, 2018

(87) PCT Pub. No.: WO2017/121785
PCT Pub. Date: Jul. 20, 2017

(65) Prior Publication Data
US 2019/0019821 A1    Jan. 17, 2019

(30) Foreign Application Priority Data
Jan. 15, 2016    (EP) .................................... 16151583

(51) Int. Cl.
*H01L 27/146*    (2006.01)
*G06T 7/521*     (2017.01)
(Continued)

(52) U.S. Cl.
CPC .......... *H01L 27/1463* (2013.01); *G06T 7/521* (2017.01); *H01L 27/1464* (2013.01);
(Continued)

(58) Field of Classification Search
CPC ............. H01L 27/1463; H01L 27/1464; H01L 27/14621; H04N 5/347
See application file for complete search history.

(56) References Cited

U.S. PATENT DOCUMENTS

2016/0161599 A1* 6/2016 Seliuchenko ........... G01S 7/484
                                                        250/338.4
2016/0225812 A1* 8/2016 Elkhatib ........... H01L 31/02327

FOREIGN PATENT DOCUMENTS

EP    2081004 A1    7/2009
EP    2787531 A1    10/2014
(Continued)

OTHER PUBLICATIONS

Myung-Jae Lee et al., Bandwidth Improvement of CMOS-APD With Carrier-Acceleration Technique, IEEE Photonics Technology Letters, vol. 27, No. 13, Jul. 1, 2015; pp. 1387-1390. (Year: 2015).*
(Continued)

*Primary Examiner* — John P. Dulka
(74) *Attorney, Agent, or Firm* — Wolf, Greenfield & Sacks, P.C.

(57) ABSTRACT

The present disclosure relates to a detector device (300) assisted by majority current (104, 105), comprising a semiconductor layer of a first conductivity type (106), at least two control regions of the first conductivity type (100, 115), at least one detection region of a second conductivity type (101, 116) opposite to the first conductivity type and a source (110) for generating a majority carrier current (104) associated with an electrical field, wherein it further comprises isolation means (103) formed in the semiconductor layer and located between said two control regions, for deflecting the first majority carrier current generated by the first source between said two control regions and, hence, increasing the length of the first majority current path,
(Continued)

reducing the amplitude of said first majority carrier current and, therefore, reducing the power consumption of the detector device.

52 Claims, 9 Drawing Sheets

(51) Int. Cl.
*H04N 5/347* (2011.01)
*H04N 5/369* (2011.01)
*H04N 5/357* (2011.01)

(52) U.S. Cl.
CPC ....... *H01L 27/14621* (2013.01); *H04N 5/347* (2013.01); *G06T 2207/10028* (2013.01); *H04N 5/357* (2013.01); *H04N 5/36961* (2018.08)

(56) References Cited

FOREIGN PATENT DOCUMENTS

| | | |
|---|---|---|
| EP | 2960952 A1 | 12/2015 |
| EP | 3029731 A1 | 6/2016 |
| KR | 10-2014-0119648 | 10/2014 |
| WO | WO 2013/104718 A2 | 7/2013 |
| WO | WO 2015/104307 | 7/2015 |
| WO | WO 2015/197685 | 12/2015 |

OTHER PUBLICATIONS

International Search Report and Written Opinion for International Application No. PCT/EP2017/050541 dated May 15, 2017.
Korean communication in connection with Application No. KR 10-2018-7023433 dated Nov. 21, 2019.
KR 10-2018-7023433, filed Nov. 21, 2019, Korean communication.

\* cited by examiner

PRIOR ART

Figure 1

PRIOR ART

Figure 2A

PRIOR ART

Figure 2B

PRIOR ART

| NC | NC | NC | NC | NC | NC | NC | NC | NC |
|----|----|----|----|----|----|----|----|----|
| NC | 0  | NC | NC | 180| NC | NC | 0  | NC |
| NC | NC | NC | NC | NC | NC | NC | NC | NC |
| NC | NC | NC | NC | NC | NC | NC | NC | NC |
| NC | 180| NC | NC | 0  | NC | NC | 180| NC |
| NC | NC | NC | NC | NC | NC | NC | NC | NC |
| NC | NC | NC | NC | NC | NC | NC | NC | NC |
| NC | 0  | NC | NC | 180| NC | NC | 0  | NC |
| NC | NC | NC | NC | NC | NC | NC | NC | NC |

| G | B | G | B | G | B | G | B | G |
|---|---|---|---|---|---|---|---|---|
| R | D | R | D | R | D | R | D | R |
| G | B | G | B | G | B | G | B | G |
| R | D | R | D | R | D | R | D | R |
| G | B | G | B | G | B | G | B | G |
| R | D | R | D | R | D | R | D | R |
| G | B | G | B | G | B | G | B | G |
| R | D | R | D | R | D | R | D | R |
| G | B | G | B | G | B | G | B | G |
| R | D | R | D | R | D | R | D | R |

Figure 11

DETECTOR DEVICE WITH MAJORITY CURRENT AND ISOLATION MEANS

This Application is a national stage filing under 35 U.S.C. § 371 of International Patent Application Serial No. PCT/EP2017/050541, filed Jan. 12, 2017, entitled "A DETECTOR DEVICE WITH MAJORITY CURRENT AND ISOLATION MEANS". Foreign priority benefits are claimed under 35 U.S.C. § 119(a)-(d) or 35 U.S.C. § 365(b) of European application number 16151583.8, filed Jan. 15, 2016. The entire contents of each of these applications are incorporated herein by reference in their entirety.

TECHNICAL FIELD OF THE INVENTION

The invention relates to a detector device assisted by majority current for detecting an electromagnetic radiation incident on a semiconductor layer, wherein a majority carrier current is generated between two control regions and wherein photo-generated minority carriers are directed towards a detection region under the influence of an electrical field generated between the control regions.

The invention can be used in imagers, particularly Time-Of-Flight imagers.

BACKGROUND OF THE INVENTION

Figure 1:
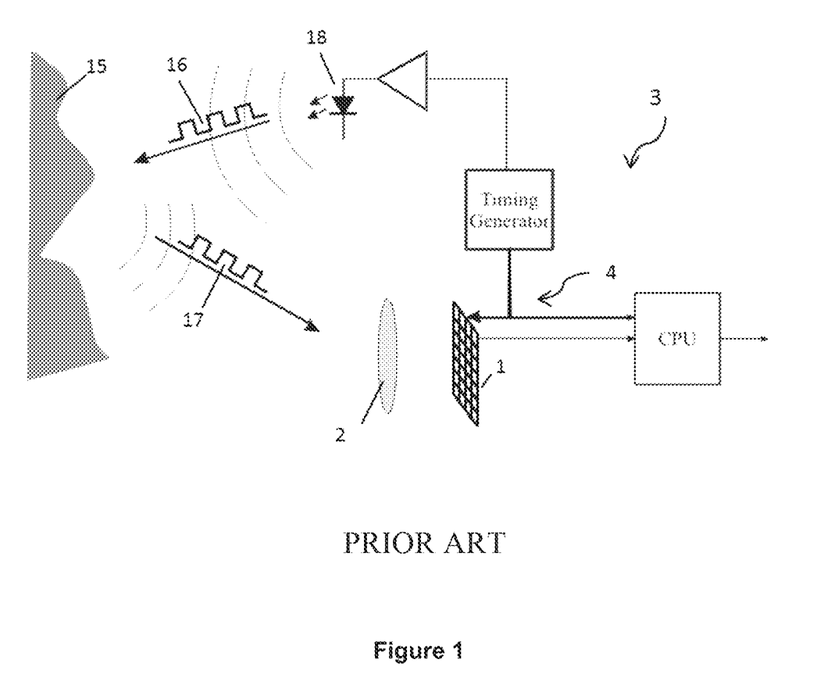
FIG. 1 illustrates the basic operational principle of a TOF system.

Nowadays, more and more detection devices implement Time-Of-Flight (TOF) technologies for obtaining depth information. A basic Time-Of-Flight (TOF) camera system 3 is illustrated in FIG. 1. TOF camera systems capture 3D images of a scene 15 by analysing the time of flight of light from a light source 18 to an object. TOF camera system 3 includes a camera with a dedicated illumination unit 18 and data processing means 4.

The operational principle of a TOF camera system is to actively illuminate the scene 15 with a modulated light 16 at a predetermined wavelength using the dedicated illumination unit, for instance with some light pulses of at least one predetermined frequency. The modulated light is reflected back from objects within the scene. A lens 2 collects the reflected light 17 and forms an image of the objects onto an imaging sensor 1 of the camera. Depending on the distance of objects from the camera, a delay is experienced between the emission of the modulated light, e.g. the so called light pulses, and the reception at the camera of those light pulses. Distance between reflecting objects and the camera may be determined as function of the time delay observed and the speed of light constant value. In another more complex and reliable embodiment, a plurality of phase differences in between the emitted reference light pulses and the captured light pulses may be determined by correlation measurement and used for estimating depth information.

Figure 2A:
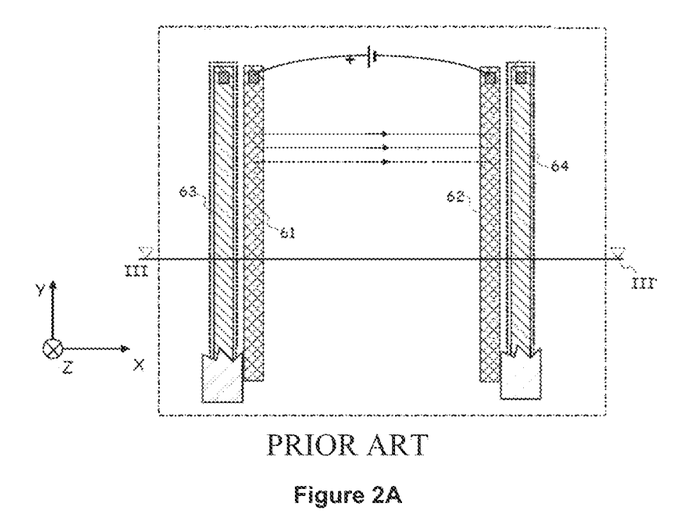
FIG. 2A shows a top view of a device according to prior art.

The determination of the phase differences can be carried out notably by Current-Assisted Photonic Demodulators (CAPDs). The principle of CAPDs is explained in EP1513202 and illustrated by FIGS. 2A-C. It is based on demodulation nodes, the so-called "taps". The CAPD represented on FIGS. 2A-C comprises two taps. Each tap consists of a control region 61, 62 and a detection region 63, 64. By controlling a potential applied between the control regions 61 and 62, it is possible to control the detectivity of the associated tap. When a photon is incident on the photosentitive area of a pixel, an electron-hole $e^-/h^+$ pair may be generated at a certain position. The electron-hole pair will be separated by an electrical field that is present and that is associated with the flowing majority current. This electrical field will cause the photogenerated minority carriers 66, 69 to drift in the opposite direction to the flowing majority current, i.e. towards the detection regions 63, 64, respectively.

Figure 2B:
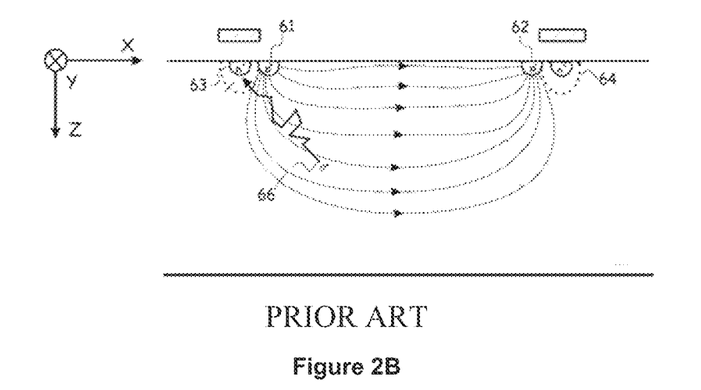
FIG. 2B and FIG. 2C show a cross-section of the device of FIG. 2A with two different current conditions.
Figure 2C:
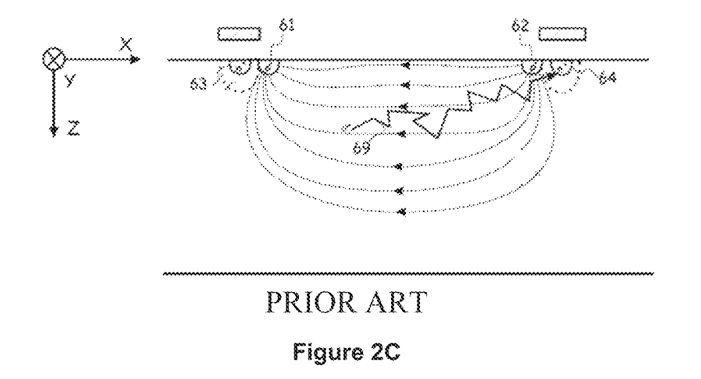

When a pixel comprises several taps and when a positive potential is applied to a tap with respect to the other taps, this tap is activated and will be receiving the majority of the photogenerated minority carriers in the pixel, as illustrated by FIGS. 2B and C. By applying appropriate driving signals to the control regions, correlation measurements can be performed and the depth perception can be obtained.

Prior art CAPDs suffer from several drawbacks to be overcome. A first challenge in CAPDs is to reduce the size of the pixels while avoiding crosstalk phenomenon i.e. parasitic charge exchange between neighbouring pixels. This crosstalk can indeed cause a loss in image quality.

Another challenge in CAPDs is to create a field between the control regions as high as possible in order to achieve a high detectivity and a high demodulation contrast. This requirement involves high power consumption; this is one of the main disadvantages of CAPDs. The power consumption P in a CAPD follows the following equation, R and ΔV being the resistance and the potential difference between the control regions, respectively:

$$P = R\left(\frac{\Delta V}{R}\right)^2 = \frac{\Delta V^2}{R}$$

The power consumption P can be reduced for instance by increasing the distance between the control regions in order to increase the resistance between them. Nevertheless, this solution suffers from the drawback of negatively affecting the size of the device.

Another challenge in CAPD devices is to improve the data binning methods for obtaining more reliable data. Indeed, in regular binning, each pixel is typically read and the information is then added. This requires more time for the higher read-out count and adds the read-out noise several times.

A solution remains to be proposed in order to decrease the power consumption of CAPDs while reducing the size of the pixels, avoiding cross talk phenomenon between the pixels and allowing an improved data binning.

SUMMARY OF THE INVENTION

The present invention relates to a detector device assisted by majority current according to claim 1.

The isolation means of the instant detector device are formed in the semiconductor layer and located between two control regions, for deflecting the first majority carrier current generated by the first source between said control regions and, hence, increasing the length of the first majority current path, reducing the amplitude of said first majority carrier current and, therefore, reducing the power consumption of the detector device.

Preferably, the isolation means of the detector device comprise at least one trench isolation region. The fact of implementing trench isolation regions between pixels is known in the art of standard RGB detectors and CMOS image sensors for decreasing the crosstalk phenomenon. It should be pointed out that the isolation trenches of the present invention are implemented for reducing the power consumption of the detector device by increasing the length of the current path without increasing the distance between them. The function of the trenches in the classic RGB detectors is totally different. It would have been totally absurd to the one skilled in the art to, in an RGB detector, wishing to increase the length of the current path because an RGB detector is not assisted by a majority carrier current. Hence, there was no reason to duplicate in a CAPD what had been implemented in an RGB detector.

The presence of isolation trench region between the taps does really offer the advantage that the amplitude of the majority carrier current is reduced. In the absence of these isolation trench barriers, large currents would start flowing between adjacent pixels, consuming a lot of power while being largely redundant for operation of the device. Because of the isolation trench regions, the majority carrier currents induced by the source are forced to flow around these isolation barriers. The distance between adjacent control regions is thus artificially increased and the power consumption of the device is consequently decreased. The current path, which was in prior art implementations straight between the control regions of the taps, is now lengthened by adding the vertical barriers. By addition of these barriers, the taps can now be closer packed and the pixels can be located closer together.

In other words, for operating the detector device of the present invention, one should provide the generation of a majority carrier current between two control regions with a deflection of said majority carrier current by increasing the length of its path, reducing its amplitude and, therefore, reducing the power consumption of the detector device. The step of deflecting the majority carrier current can be achieved by forming isolation means, preferably trench isolation regions, in the semiconductor layer between two control regions.

Advantageously, the thickness of the semiconductor layer is adapted for Back Side Illumination (BSI) and the detection region, the control regions and the isolation means are formed in the front side of the semiconductor layer. This BSI configuration comprising isolation means between the taps enables to decrease the power consumption of the detector while reducing the size of the pixels and avoiding cross talk phenomenon between the taps.

The detector device of the present invention comprises, more advantageously, a second source for generating at least one second majority carrier current in the semiconductor layer between at least one control region, formed in the front side of the semiconductor layer, and the backside of semiconductor layer, said second majority carrier current being associated with a respective second electrical field, the generated minority carriers being directed towards the front side of the semiconductor layer under the influence of the second electrical field respectively associated with the at least one second majority carrier current. In this embodiment, the minority carriers generated close to the backside of the semiconductor device are more easily collected by the detection regions of the detector.

More preferably, the detector device of the present invention further comprises a plurality of adjacent taps respectively associated with a plurality of isolation means located therebetween for deflecting a plurality of associated first majority carrier currents, each tap comprising at least one detection region and at least one control region, and control circuitry arranged for controlling the first source and controlling separately at least one of said deflected first majority carrier currents.

The control circuitry is advantageously arranged to put two adjacent taps in a non-sensing state, by reducing or eliminating an associated first majority carrier current, to allow redirection of the generated minority carriers to the closest sensing detection region.

Thanks to this individual and separate control, one larger pixel is artificially created and the operational pixel structure is enlarged to a bigger operation zone, similar to what would happen if the data of the pixels were binned together during post-processing. This individual and separate control offers the advantage of requiring only one read-out for the artificially bigger pixel. In regular binning, each pixel is typically read and then the information is added afterwards. This requires more time for the higher read-out count and adds the read-out noise several times. Those two points are improved in the suggested approach. This individual and separate control is improved thanks to the isolation means between the taps, since they provide a very reliable isolation even with very small area pixels.

The trench isolation regions of the detector device of the present invention are preferably biased with a potential to avoid channel formation on the etch surface. More preferably, the trench can be covered with an insulator and either filled with a conductive or semiconductor material.

More advantageously, a further trench isolation region is formed at the backside of the semiconductor layer to prevent deeper penetrating light beams from entering adjacent pixel regions.

The first source may also be adapted for supplying a DC voltage, resulting in only vertical fields.

BRIEF DESCRIPTION OF THE DRAWINGS

The present invention shall be better understood in light of the following description and the accompanying drawings.

DESCRIPTION OF THE INVENTION

The invention will be explained with reference to p-type epitaxial layer and substrate, but the present disclosure includes within its scope a complementary device whereby p and n regions become n and p regions respectively. A skilled person can make such modification without departing from the spirit of the invention.

It should also be understood that the terms n, p, $n^+$, $p^+$ and $p^-$, n-well, p-well, deep n-well and deep p-well are well known by the one skilled in the art. The terms n, p, $n^+$, $p^+$ and $p^-$ refer to ranges of doping levels in semiconductor materials well known by the one skilled in the art.

The terms n and p refer to n-doped and p-doped regions, usually arsenic and boron doped regions, respectively. $n^+$, $p^+$ refer to highly doped shallow contact regions for NWELL and PWELL respectively. $p^-$ refers to lowly doped p type region such as a PWELL.

The present disclosure relates to embodiments regarding both Front Side Illumination (FSI) and Back Side Illumination (BSI) devices. Front Side Illumination and Back Side Illumination devices are defined by referring to the location of the circuitry on the chip compared to the incident light. By FSI, it is meant a device where the light is incident on the same side than the circuitry. With FSI, light falls on the front side of the circuitry, and passes through the readout circuitry and interconnects before it is collected in the photodetector. On the contrary, by BSI, it is meant a device where the light is incident on the other side, where the circuitry is not located, i.e. in the backside. The main idea behind the fact of using BSI structure is that no light is lost while passing through the circuitry.

Figure 3:
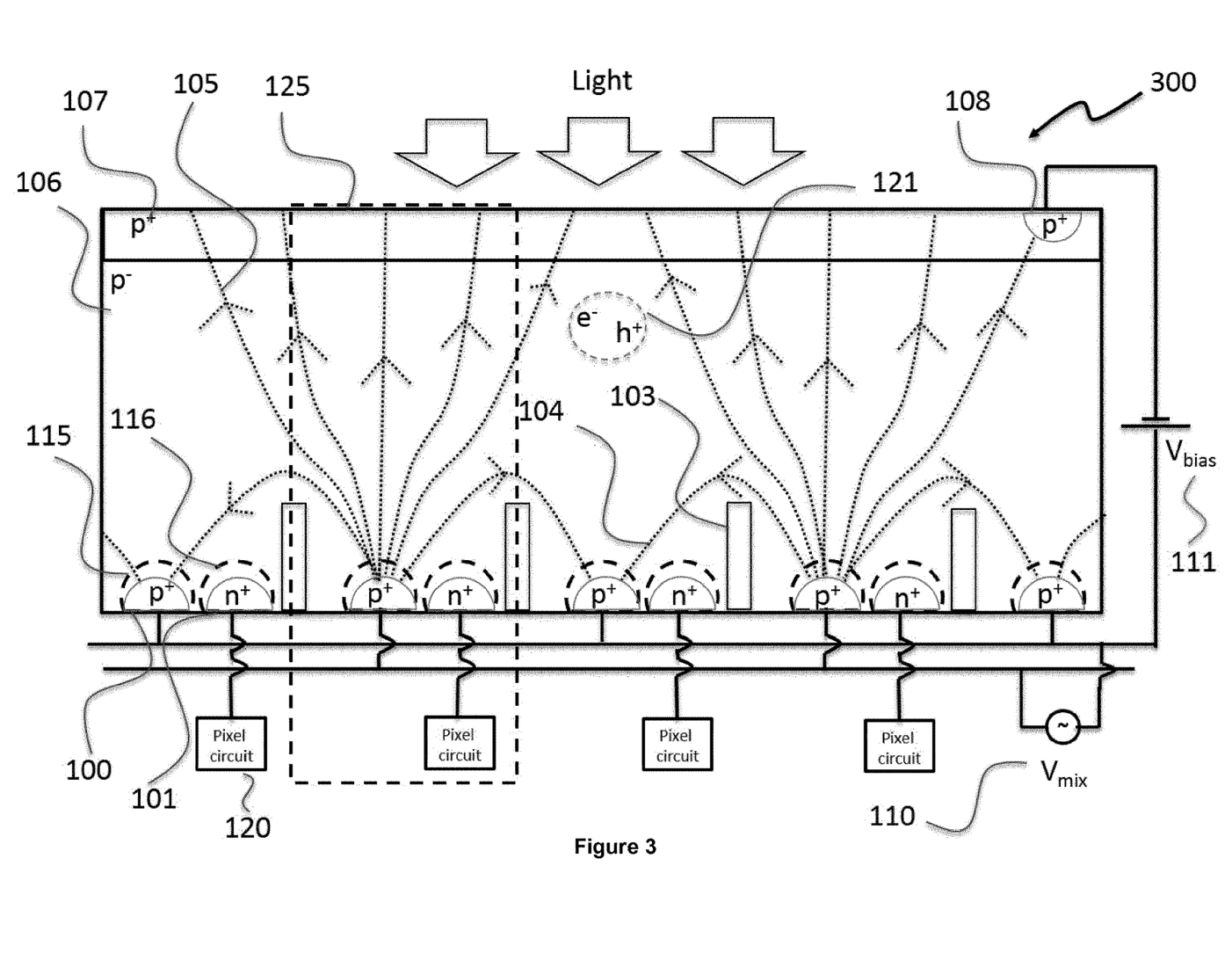
FIG. 3 shows a preferred embodiment of the detector device according to the present invention.

FIG. 3 shows a preferred embodiment of a detector device according to the present invention. It should be understood that the exemplary detector device illustrated in FIG. 3 may comprise further elements. In reality, many more features could be present, such as junctions, diffusion layers, photo gates, etc. In FIG. 3, only the minimum elements to be able to explain and disclose properly the features of this invention over the state of the art are depicted and described.

The detector device 300 of the present disclosure is assisted by majority current for detecting an electromagnetic radiation. The radiation can be any type of radiation, but preferably light in the visible range or an infrared radiation.

The detector device 300 comprises a semiconductor layer 106 on which an electromagnetic radiation can be incident for generating therein pairs of majority and minority carriers 121. The semiconductor layer 106 is doped with a dopant of a first conductivity type, a p dopant in the example of FIG. 3. This semiconductor layer 106 is preferably p-doped.

The detector device 300 further comprises at least two control regions 100, 115 formed in the semiconductor layer 106. The control regions 100, 115 are p doped in the exemplary embodiment. The control regions may comprise a p+ diffusion region 100 and a p-well 115, so that the p+ diffusion region 100 and the p-well 115 form together the control region.

A first source $V_{mix}$ is provided for generating at least one first majority carrier current 104 in the semiconductor layer 106 between pairs of control regions, the first majority carrier currents 104 being associated with a respective first electrical field. This source $V_{mix}$ may be a AC voltage source or a DC voltage source, as it will be explained later. This source $V_{mix}$ is defined in this document as a voltage source, but might as well be implemented as a current source. All voltage sources discussed in the rest of this document (110, 111) could as well be replaced with current sources.

Although voltage sources are preferred, current sources have advantages with respect to their output impedance and hence can provide benefits as well.

The detector device further comprises at least one detection regions 101, 116 formed in the semiconductor layer 106 and being doped with a dopant of a second conductivity type opposite to the first conductivity type, i.e. a n dopant here, for forming a junction and collecting generated minority carriers. In FIG. 3, two detection regions 101, 116 are shown, but the invention is not limited thereto and could be implemented with only one detection region for instance. The minority carriers are directed towards the detection region 101, 116 under the influence of the first electrical field respectively associated with the at least one first majority carrier current 104. The detection regions may comprise a n+ diffusion region 101 and a n-well 116 so that the n+ diffusion region 101 and the n-well 116 form together the detection regions.

The detection regions and the control regions are associated in taps, one tap comprising at least one detection region and at least one control region. In this disclosure we will assume that each pixel 125 of the detector device 300 comprises one tap. In practice, the pixel 125 may comprise more than one tap (e.g. 2-tap, 4-tap, . . . ). One pixel comprises all the elements encircled by the dashed line 125 in FIG. 3.

The detector device 300 further comprises isolation means 103, formed in the semiconductor layer 106 and located between the two control regions, for deflecting the first majority carrier current 104 generated by the first source $V_{mix}$ between the control regions and, hence, increasing the length of the first majority current path, reducing the amplitude of said first majority carrier current 104 and, therefore, reducing the power consumption of the detector device 300. These isolation means may comprise at least one trench Isolation region 103, which can be disposed at various positions between the pixels.

The isolation means, e.g. the isolation trench regions 103, force the induced currents, i.e. the majority carrier currents 104 induced by $V_{mix}$ 110, to flow around these isolation barriers. The distance between the adjacent control regions is thus artificially increased and the power consumption of the device is thus decreased.

The isolation trench regions 103 or isolation barriers can be implemented in many different ways, e.g. by etching techniques, such as deep or shallow trench etching, or by implementing isolation barriers applied before growing epitaxial layers. The most important is that they induce an electric barrier between adjacent pixels.

Figure 4:
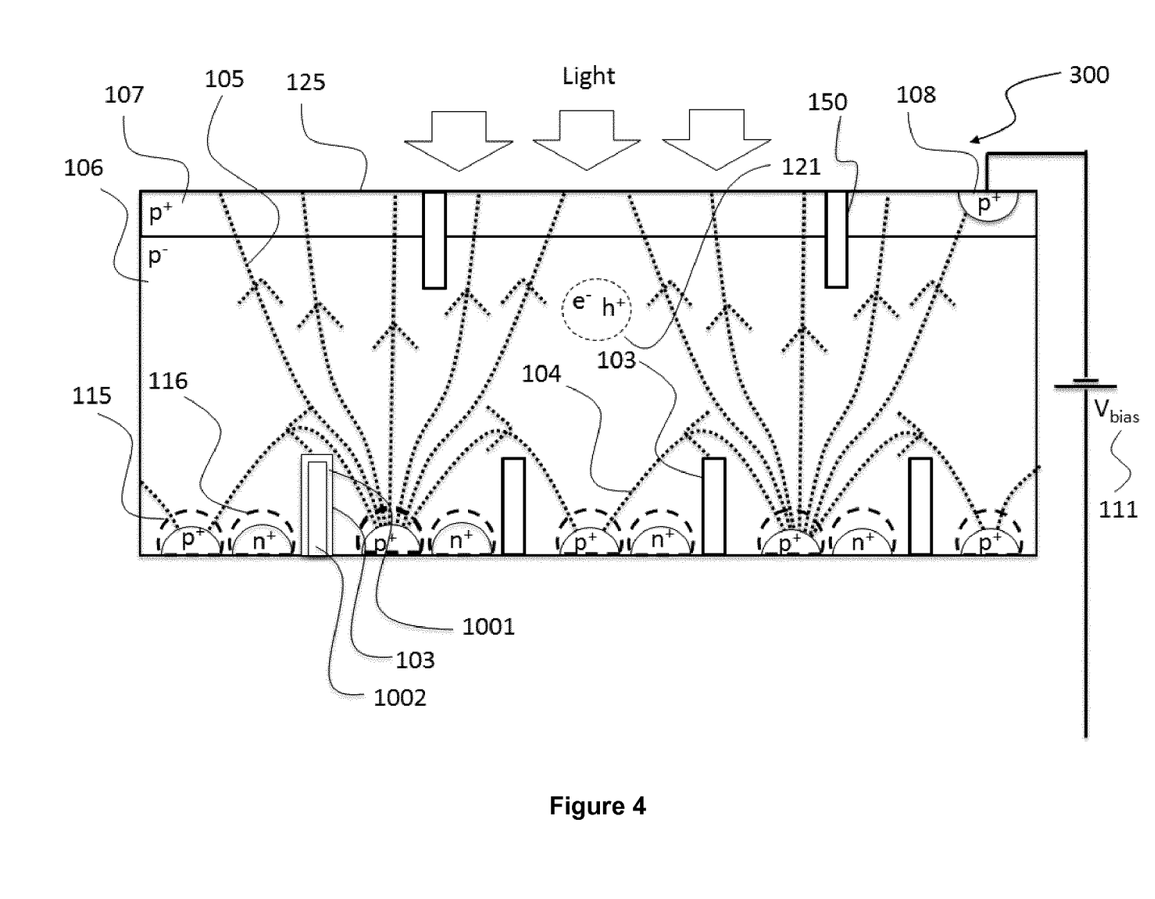
FIG. 4 shows a further embodiment of the detector device according to the present invention.

This barrier 103 can be treated in a number of ways to avoid leakage along the barrier, the leakage being in the form of surface states and a leaky etched surface. To avoid this, the isolation trench 103, can be for example a deep etch, with an isolator 1001 between the silicon surface of the etch. This can be for example, but not limited to, a silicium-oxide, and for example (but not limited to) a polysilicon plug 1002 in the etched trench, which allows to bias the potential of the polysilicon plug to avoid channel formation on the etch surface, as illustrated in FIG. 4. The isolation means, for instance the trench isolation regions 103, are preferably biased with a potential. The trench isolation region or the deep trench isolation region can be filled with an electrical conductive material or semiconductor such that a voltage can be applied.

Care must be taken when implementing these isolation barriers, for example in the form of a deep trench isolation. The creation of deep trenches typically harms the silicon substrate and increases dark current of the pixels or taps. In RGB image sensors that use trench isolation, the trench is passivated by for example doping the newly formed silicon surface of the sidewalls and bottom of the trench with p-type implants. This is however not a very good option in the scope of the present is invention, as the isolation is intended to increase the path resistance for majority carriers between taps, and this effect would be countered when the trench would be doped as the doping would reduce the resistance of the surface of the trench.

Other passivation means can be used however, for example the trench could be covered with an insulator such as a thin oxide or a nitride or another insulator and then filled with a conductive or semiconductor material, said trench covered with the insulator and filled with the conductive or semiconductor material acting as a gate that can be biased, The covering with the insulator and the filling with a conductive or semiconductor material that can be biased influences the surfaces of the trench as it may make it be rendered electrically inactive by avoiding interaction of minority carriers with the trench surface itself.

The detector device 300 of the present invention may comprise at least one further trench isolation region 150 formed at the backside of the semiconductor layer 106, as illustrated in FIG. 4. The function of these further trench isolation regions 150 is to prevent deeper penetrating light beams from entering adjacent pixel regions.

The trench isolation regions 103, 150, formed in the front side of the semiconductor layer or both in the front side and in the backside of the semiconductor layer, may comprise Deep Trench Isolation regions and/or Ultra Deep Trench Isolation regions.

Preferably, the thickness of the semiconductor layer is adapted for Back Side Illumination (BSI) and the detection region 101, 116, the control regions 100, 115 and the isolation means 103 are formed in the front side of the semiconductor layer 106.

More preferably, a second source $V_{bias}$ 111 is implemented within the detector device 300 for generating a second majority carrier current 105 in the semiconductor layer 106 between the front side and the backside of the semiconductor layer 106, for instance between at least one control region 100, 115 formed in the front side of the semiconductor layer 106 and the backside of semiconductor layer 106. Said second majority carrier current 105 is associated with a respective second electrical field. The generated minority carriers are directed towards the front side of the semiconductor layer 106 under the influence of the second electrical field respectively associated with the at least one second majority carrier current 105.

The backside of the detector device 300 may comprise a passivation layer 107 formed on the backside of the semiconductor layer 106 and being doped with a dopant of the first conductivity type, e.g. a p+ doped layer 107. This helps spread the field applied using source 111.

Another option is to have a lowly doped epitaxial on top of a highly doped substrate. This substrate can then as well serve to spread the voltage applied using source 111 and could be thinned to reduce its thickness.

The detector device 300 may further comprise at least one contact region 108 formed on the backside of the semiconductor layer 106 and being doped with a dopant of the first conductivity type. The second majority carrier current 105 is generated by the second source 111 in the semiconductor layer 106 between the at least one control region 100, 115 formed in the front side of the semiconductor layer 106 and said contact region 108.

Another way to contact the backside could be a deep-pwell structure at the front side, deep enough to connect to the passivation layer 107. Hence this pwell can be biased from the frontside and allows applying and controlling the strength of the second electrical field. Thus, the passivation layer 107 may be contacted using a deep well formed in the front side of the semiconductor layer 106.

It should be understood that, even without implementing such elements 107, 108 and 111, the operation of the detector device 300 in BSI configuration is possible, since a built-in electrical field is typically present vertically within the device 300. These elements are optionally implemented for enhancing the second electrical field.

The voltage sources $V_{mix}$ 110, and $V_{bias}$ 111, invoke guiding fields in the semiconductor layer. $V_{mix}$ is applied over adjacent pixels as shown, while $V_{bias}$ induces a voltage delta between the front side and the backside of the semiconductor layer 106. These voltage sources 110 and 111 induce first majority carrier currents 104 between the pixels, and second majority carrier currents 105 from front to back, respectively. Opposite with the current sense, an electric field is induced. When the light hits the semiconductor layer 106 from the backside, electron hole pairs 121 are generated. The holes flow with the induced majority current, towards the backside, while the electron is guided towards the front side. When nearing the front side, the electron will be driven to the pixel with the highest biased p+ diffusion 100, where it will enter the adjacent n+ diffusion 101 and enter the pixel readout circuit 120 for further processing. This circuit 120 can be a 3T, 4T or other pixel read-out circuit. The processing circuitry 120 may be arranged for sampling a value related to the minority carrier charge collected by the detection regions and for processing said value and outputting Time-Of-Flight data.

The following invention also enables a smart organisation of pixel structures and enables improvement of data binning methods in TOF imagers. Binning is the adding together of the individual pixel informations, typically to improve signal-to-noise ratio of the binned information.

Figure 5:
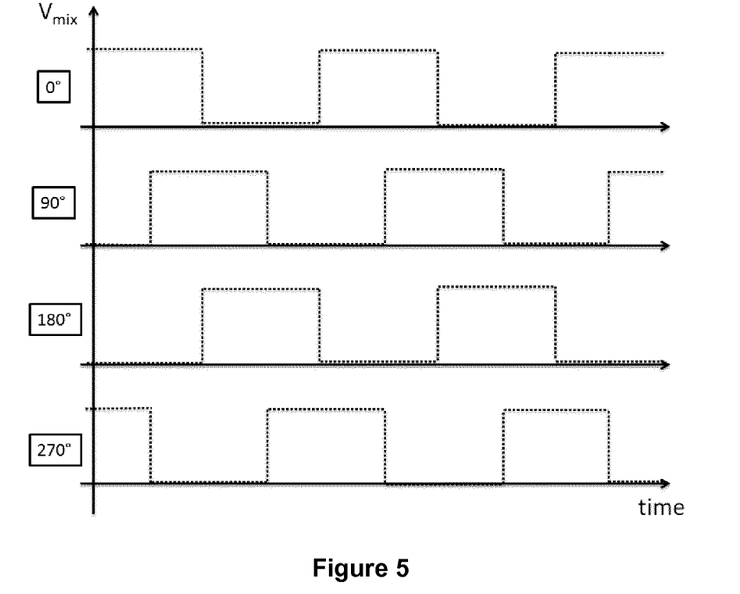
FIG. 5 shows a possible family of signals to be used by the first source of FIG. 3.

FIG. 5 shows a possible family of signals to be used by the source $V_{mix}$ 110 of FIG. 3. Although any range of time/phase delays (in seconds or 0-360°) and signal shapes (sinusoidal, PRBS, sawtooth, square, . . . ) can be used, we will use in this description square waves and combinations of 0°/90°/180°/270° phase delays, where the 0° signal is typical used for the modulated light signal.

Figure 6:
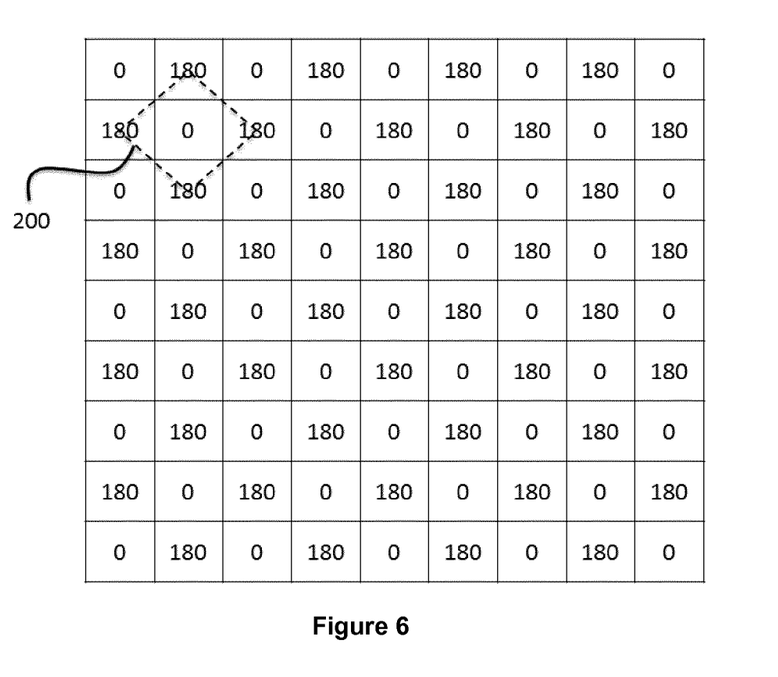
FIG. 6 to FIG. 9 show different phase configurations of pixels in the detector device according to the present invention.

FIG. 6 shows a schematic on how to organize the pixel in a detector device, e.g. a TOF imager, where a checkerboard pattern is used, applying 0° and 180° out of phase signals. The pixels marked with a 0, are connected to one terminal of the source $V_{mix}$ 110 shown in FIG. 3, while pixels marked with 180 are connected to the other side. In a typical operation two measurements are taken: one with 0 and 180 degree phase delay, and subsequently one with 90 and 270 degree phase shifted measurement.

For one pixel, the operation zone 200 is shown, which extends beyond an individual cell. This operation zone is similar for all the pixels in the array and due to the field lines extending outside the pixel boundaries when nearing the sensitive surface, as shown in FIG. 3.

Therefore, all the acquired information overlaps and is post-processed to calculate the individual 0, 90, 180, 270 degree phase shifted data. This is typically done using the surrounding pixel data in time and space. For example doing simple interpolation, using median or average values or by choosing data combinations based on extra information, such as gradients/edges or detected movement.

In traditional color sensors similar concepts exists to achieve this, called demosaicing, where it is typically used to achieve per pixel red, green, blue data, as known by a person skilled in the art.

Organising a ToF imager in such a way enables use of all the incident light, as it is at all times captured in a detector node, while not requiring a high number of taps in each pixel, which would require a bigger pixel structure. This configurability of the virtual pixel size is obtained by re-organising the electric fields in the CAPD as explained in this disclosure.

It is also possible to design an image sensor comprising a plurality of detector devices, the image sensor being arranged for implementing an extra demosaicing step to calculate individual pixel data from the overlapping pixel data obtained.

Figure 7:
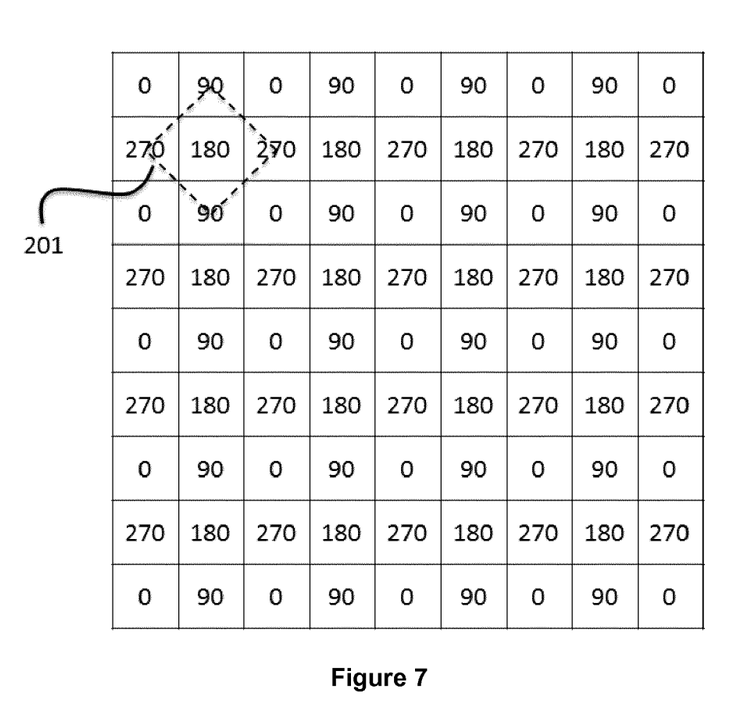

Another scheme is shown in FIG. 7, where the data related to 0, 90, 180, 270 degree are obtained in parallel by driving the different phase shifted $V_{mix}$ signals to different pixels in the imager.

In order to increase Signal-to-Noise ratio, it is important to have flexible mechanisms to bin pixel data together, creating one larger pixel. The detector device 300 of the present disclosure resolves this specific issue as follows.

The detector device 300 of the present disclosure may comprise a plurality of adjacent taps respectively associated with a plurality of isolation means 103, 1001, 1002 located therebetween for deflecting a plurality of associated first majority carrier currents 104. Each tap may comprise at least one detection region and at least one control region. The detector device may also comprise control circuitry arranged for controlling the first source 110 and controlling separately at least one of said deflected first majority carrier currents 104.

The control circuitry may also be arranged for cancelling temporally at least one of said deflected first majority carrier currents 104 by driving the source $V_{mix}$ 110 appropriately.

The control circuitry may also be arranged for reducing or eliminating the associated taps from participating in detecting the generated minority carriers, as explained herein below.

The control circuitry may also be arranged for achieving pixel binning, as explained herein below.

Figure 8:
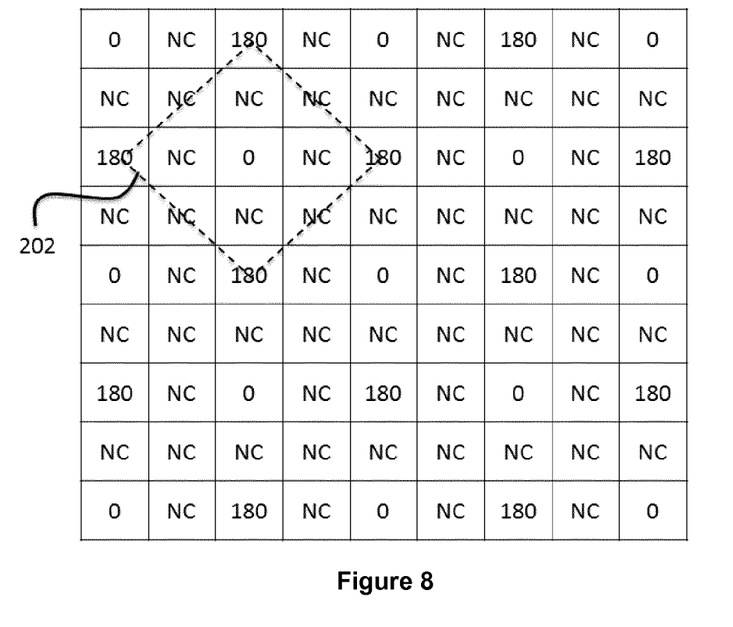

In FIG. 8, a scheme is shown whereby several pixels are put in a Not Connected-state (=NC), in which the field lines bypass the NC cells and are directed only to the remaining operational cells. The light incident on the pixels in the NC-state will then be distributed over the adjacent pixels that are connected to a $V_{mix}$ signal. Hence the operational pixel structure is enlarged to operation zone 202, similar to what would happen if pixels were to be binned together, but requiring only one pixel to be read-out.

In practice the pixels in the NC-state could be isolated from each other, but alternatively could be minimally connected with a weaker voltage or different voltage. The object of this state is to put two adjacent taps in a non-sensing state by modifying an associated first majority carrier current to allow re-direction of the generated minority carriers, here electrons, to the closest sensing detection region.

The non-sensing state of said two adjacent taps may be obtained by disconnecting their control regions so that the associated first majority carrier current (104) is eliminated. Alternatively, the non-sensing state of said two adjacent taps may be obtained by connecting their control regions to a predetermined voltage so that the associated first majority carrier current (104) is reduced, the predetermined voltage being lower than a voltage used in a sensing state.

In other word, instead of putting the pixel in a NC-state where it would not participate, the pixel can be put in a state where it would still participate, but receive less signal. This can be advantageous to create more dynamic range or enable ambient light robustness.

Alternatively, as shown in FIG. 6, the non-sensing state of two adjacent taps is obtained by modifying the polarity of the majority carrier current between said two adjacent taps.

Figure 9:
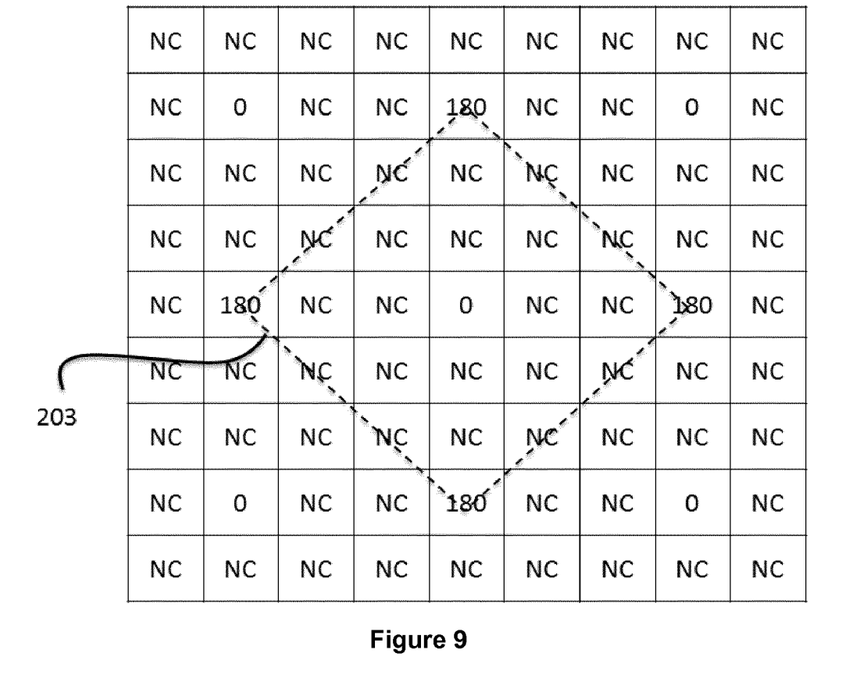

To illustrate further the concept, in FIG. 9, an even bigger pixel with an operation zone 203 is obtained by putting even more pixels in the NC state. Concretely any shape or structure of NC versus connected pixels can be made, where the light entering above the NC pixel structure is equally distributed over the surrounding connected pixels.

These binning states can be decided at run-time by configuring pixels in the NC state, while others are kept operational. This allows for a very flexible binning approach, configurable at run-time.

The FIGS. 8 and 9 show 0 and 180 measurement configurations. Obviously, 90 and 270 degree measurements could be obtained again in subsequent measurements, or by configuring the pixel scheme to obtain this in parallel as illustrated in the operation zone 201 of FIG. 7.

Figure 10:
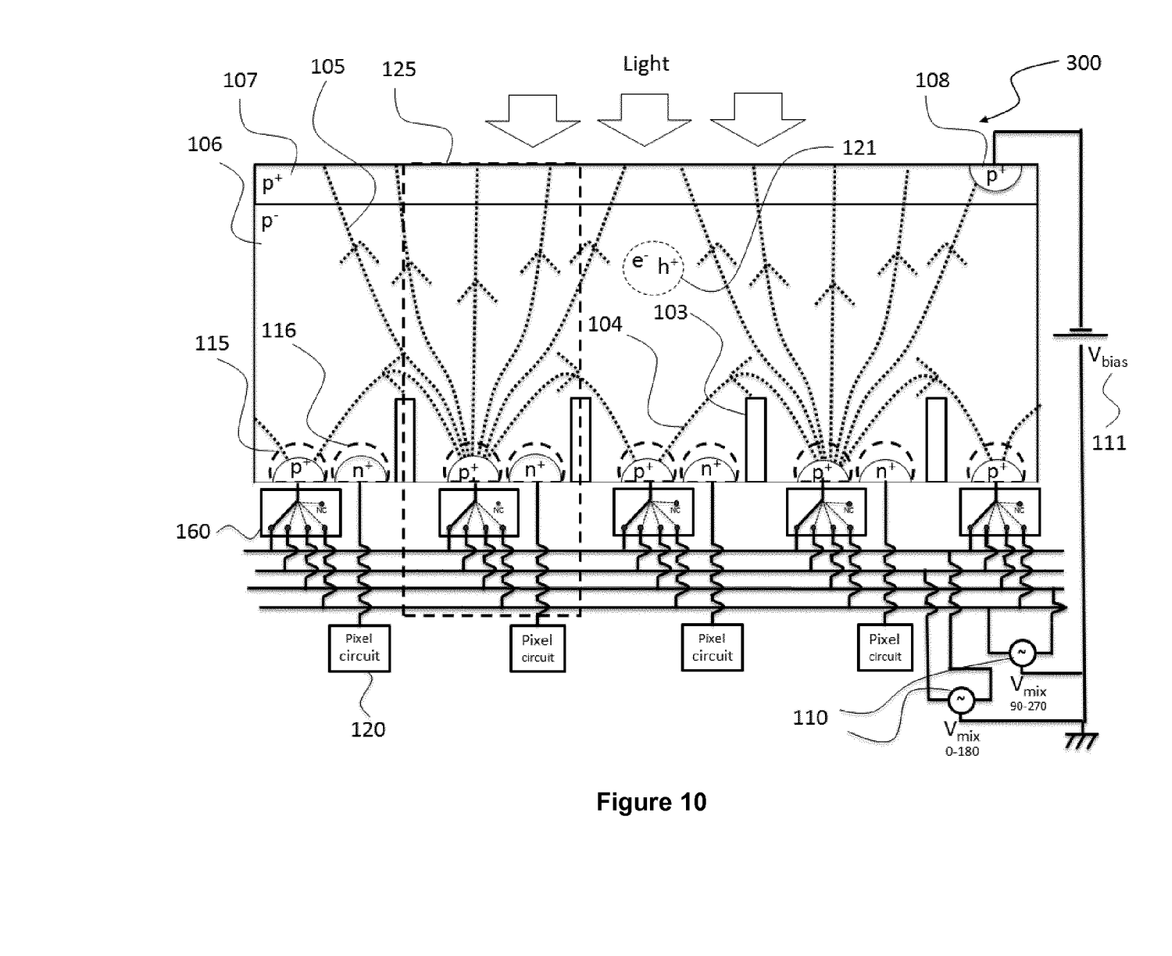
FIG. 10 shows another embodiment of the detector device of the invention.

In FIG. 10, another embodiment of the detector device 300 of the present disclosure is represented. FIG. 10 explains the practical implementation of TOF measurements and data binning. A selector 160 is implemented for selecting a predetermined voltage $V_{mix}$ to be applied to the control regions 115, thanks to the first source 110. Thanks to the selector 160, in TOF operation of the device, several different modulation signals can be operating the regions through the $V_{mix}$ voltage sources 110, to achieve the needed TOF correlation signals (e.g. 0°, 90°, 180°, 270°. Within each pixel, the selector 160 is implemented to select the modulation signal driven to the guiding control region, or select the NC node, allowing for the binning operation as presented in FIGS. 8 and 9. If a memory element is present in each pixel for enabling a selection per pixel of the signal, arbitrary binning patterns can be implemented.

When illumination of specific zones can be turned on/off at run-time, one could build a system where the illumination of specific zones is turned on/off in orchestration with the sensor zones being turned on/off. An illumination type that could achieve this is a VCSEL array.

Furthermore, some zones where the light is only detected and not demodulated could be envisaged, by selecting a DC voltage (not shown). This allows creating a non-TOF operating mode, attracting the light in a continuous mode.

Figure 11:
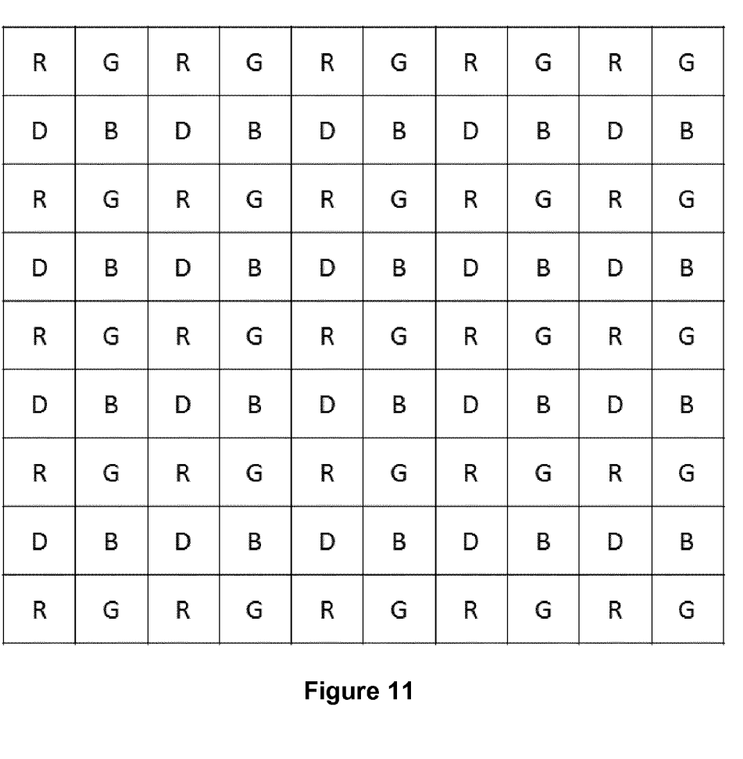
FIG. 11 shows an exemplary embodiment of the detector device comprising optical filters according to the present invention.

In FIG. 11, another embodiment of the detector device of the present invention is shown. An RGBZ implementation is shown, wherein some optical filters are applied on top of the front side or backside of the semiconductor layer, depending on the FSI or BSI configuration, to only pass for example Red+IR light (represented by R in the FIG. 11), Green+IR light (represented by G in the FIG. 11), Blue+IR light (represented by B in the FIG. 11), IR light (represented by D in the FIG. 11). At a later stage, or in parallel, the first source 110 is adapted for supplying a DC voltage. RGB and IR intensity data can thus be obtained by operating the device in non-TOF by applying DC voltages to the first source 110 $V_{mix}$. It could also be beneficial to be able to do a regular read of the RGB signals entering the frontside. This could be obtained applying DC voltages on the first source 110 $V_{mix}$ for each pixel, resulting in only vertical fields. This will help to induce only vertical motion to the electrons and keep the lateral position where the electron hole pair was photogenerated. This then helps to not mix the electrons generated underneath the different filters that could be applied on top of each individual cell (Red, Green, Blue, IR, Red+IR, Green+IR, Blue+IR, . . . ).

The invention claimed is:

1. A detector device assisted by a majority current for detecting electromagnetic radiation, the detector device comprising:
   a semiconductor layer doped with a dopant of a first conductivity type, the semiconductor layer arranged so that the electromagnetic radiation enters the semiconductor layer and generates therein pairs of majority and minority carriers;

at least two control regions formed in the semiconductor layer, the at least two control regions being doped with a dopant of the first conductivity type;

a first source for generating at least one first majority carrier current in the semiconductor layer between the at least two control regions, the at least one first majority carrier current being associated with at least one first electrical field;

at least one detection region formed in the semiconductor layer and being doped with a dopant of a second conductivity type different than the first conductivity type, the at least one detection region forming a junction in the semiconductor layer and collecting generated minority carriers, the minority carriers being directed towards the detection region under the influence of the at least one first electrical field; and at least one isolation region formed in the semiconductor layer and located between the at least two control regions, the isolation regions deflecting the at least one first majority carrier current generated by the first source between the at least two control regions, wherein a thickness of the semiconductor layer is adapted for back side illumination and wherein the at least one detection region, the at least two control regions and the at least one isolation region are formed on a front side of the semiconductor layer, the front side opposing a back side of the semiconductor layer and comprising circuitry coupled to the semiconductor layer.

2. The detector device according to claim 1, wherein the at least one isolation region comprises at least one trench isolation region.

3. The detector device according to claim 1, further comprising a passivation layer formed on the back side of the semiconductor layer and being doped with a dopant of the first conductivity type, the passivation layer being contacted using a deep well formed in the front side of the semiconductor layer.

4. The detector device according to claim 1, further comprising a plurality of adjacent taps, each respectively associated with a one of the at least one isolation region located therebetween for deflecting the at least one first majority carrier current, each tap of the plurality of adjacent taps comprising at least one of the at least one detection regions and at least one of the at least one control regions; and further comprising control circuitry arranged for controlling the first source and controlling separately the at least one first majority carrier current deflected by the one of the at least one isolation region.

5. The detector device of claim 4, wherein the control circuitry is further arranged to put two adjacent taps of the plurality of adjacent taps in a non-sensing state by modifying a first majority carrier current of the at least one first majority carrier current to allow re-direction of generated minority carriers to a closest sensing detection region of the at least one detection region.

6. The detector device according to claim 5, wherein the non-sensing state of the two adjacent taps of the plurality of adjacent taps is obtained by disconnecting control regions of the two adjacent taps.

7. The detector device according to claim 5, wherein the non-sensing state of the two adjacent taps of the plurality of adjacent taps is obtained by connecting control regions of the two adjacent taps to a predetermined voltage, the predetermined voltage being lower than a voltage used in a sensing state.

8. The detector device of claim 5, wherein the non-sensing state of the two adjacent taps of the plurality of adjacent taps is obtained by modifying a polarity of the first majority carrier current between said two adjacent taps.

9. The detector device according to claim 4, wherein the control circuitry is further arranged for achieving pixel binning.

10. The detector device according to claim 1, wherein the at least one isolation region comprises a trench covered with an insulator and then filled with a conductive or semiconductor material.

11. The detector device according to claim 1, further comprising at least one further trench isolation region formed in the back side of the semiconductor layer.

12. The detector device according to claim 1, further comprising processing circuitry arranged for sampling a value related to minority carrier charges collected by the at least one detection region and for processing said value and outputting Time-Of-Flight data.

13. The detector device according to claim 1, further comprising optical filters on the front side or the back side of the semiconductor layer.

14. A detector device assisted by a majority current for detecting electromagnetic radiation, the detector device comprising:

a semiconductor layer doped with a dopant of a first conductivity type, the semiconductor layer arranged so that the electromagnetic radiation enters the semiconductor layer and generates therein pairs of majority and minority carriers;

at least two control regions formed in the semiconductor layer, the at least two control regions being doped with a dopant of the first conductivity type;

a first source for generating at least one first majority carrier current in the semiconductor layer between the at least two control regions, the at least one first majority carrier current being associated with at least one first electrical field;

at least one detection region formed in the semiconductor layer and being doped with a dopant of a second conductivity type different than the first conductivity type, the at least one detection region forming a junction in the semiconductor layer and collecting generated minority carriers, the minority carriers being directed towards the detection region under the influence of the at least one first electrical field;

at least one isolation region formed in the semiconductor layer and located between the at least two control regions, the isolation regions deflecting the at least one first majority carrier current generated by the first source between the at least two control regions; and a second source for generating at least one second majority carrier current in the semiconductor layer between a front side of the semiconductor layer and a back side of semiconductor layer, the front side opposing a back side of the semiconductor layer and comprising circuitry coupled to the semiconductor layer, wherein the second majority carrier current is associated with a second electrical field, and generated minority carriers of the at least one second majority carrier current are directed towards the front side of the semiconductor layer under the influence of the second electrical field.

15. The detector device according to claim 14, further comprising a passivation layer formed on the back side of the semiconductor layer and being doped with a dopant of the first conductivity type, the passivation layer being contacted using a deep well formed in the front side of the semiconductor layer.

16. The detector device according to claim 14, further comprising a plurality of adjacent taps, each respectively associated with a one of the at least one isolation region located therebetween for deflecting the at least one first majority carrier current, each tap of the plurality of adjacent taps comprising at least one of the at least one detection regions and at least one of the at least one control regions; and further comprising control circuitry arranged for controlling the first source and controlling separately the at least one first majority carrier current deflected by the one of the at least one isolation region.

17. The detector device of claim 16, wherein the control circuitry is further arranged to put two adjacent taps of the plurality of adjacent taps in a non-sensing state by modifying a first majority carrier current of the at least one first majority carrier current to allow re-direction of generated minority carriers to a closest sensing detection region of the at least one detection region.

18. The detector device according to claim 17, wherein the non-sensing state of the two adjacent taps of the plurality of adjacent taps is obtained by disconnecting control regions of the two adjacent taps.

19. The detector device according to claim 17, wherein the non-sensing state of the two adjacent taps of the plurality of adjacent taps is obtained by connecting control regions of the two adjacent taps to a predetermined voltage, the predetermined voltage being lower than a voltage used in a sensing state.

20. The detector device of claim 17, wherein the non-sensing state of the two adjacent taps of the plurality of adjacent taps is obtained by modifying a polarity of the first majority carrier current between said two adjacent taps.

21. The detector device according to claim 16, wherein the control circuitry is further arranged for achieving pixel binning.

22. The detector device according to claim 14, wherein the at least one isolation region comprises a trench covered with an insulator and then filled with a conductive or semiconductor material.

23. The detector device according to claim 14, further comprising at least one further trench isolation region formed in the back side of the semiconductor layer.

24. The detector device according to claim 14, further comprising processing circuitry arranged for sampling a value related to minority carrier charges collected by the at least one detection region and for processing said value and outputting Time-Of-Flight data.

25. The detector device according to claim 14, further comprising optical filters on the front side or the back side backside of the semiconductor layer.

26. The detector device according to claim 14, wherein the at least one isolation region comprises at least one trench isolation region.

27. A detector device assisted by a majority current for detecting electromagnetic radiation, the detector device comprising:

a semiconductor layer doped with a dopant of a first conductivity type, the semiconductor layer arranged so that the electromagnetic radiation enters the semiconductor layer and generates therein pairs of majority and minority carriers;

at least two control regions formed in the semiconductor layer, the at least two control regions being doped with a dopant of the first conductivity type;

a first source for generating at least one first majority carrier current in the semiconductor layer between the at least two control regions, the at least one first majority carrier current being associated with at least one first electrical field;

at least one detection region formed in the semiconductor layer and being doped with a dopant of a second conductivity type different than the first conductivity type, the at least one detection region forming a junction in the semiconductor layer and collecting generated minority carriers, the minority carriers being directed towards the detection region under the influence of the at least one first electrical field;

at least one isolation region formed in the semiconductor layer and located between the at least two control regions, the isolation regions deflecting the at least one first majority carrier current generated by the first source between the at least two control regions, wherein the at least one isolation region is biased with a potential.

28. The detector device according to claim 27, wherein the at least one isolation region comprises at least one trench isolation region.

29. The detector device according to claim 27, further comprising a passivation layer formed on the back side of the semiconductor layer and being doped with a dopant of the first conductivity type, the passivation layer being contacted using a deep well formed in the front side of the semiconductor layer.

30. The detector device according to claim 27, further comprising a plurality of adjacent taps, each respectively associated with a one of the at least one isolation region located therebetween for deflecting the at least one first majority carrier current, each tap of the plurality of adjacent taps comprising at least one of the at least one detection regions and at least one of the at least one control regions; and further comprising control circuitry arranged for controlling the first source and controlling separately the at least one first majority carrier current deflected by the one of the at least one isolation region.

31. The detector device of claim 30, wherein the control circuitry is further arranged to put two adjacent taps of the plurality of adjacent taps in a non-sensing state by modifying a first majority carrier current of the at least one first majority carrier current to allow re-direction of generated minority carriers to a closest sensing detection region of the at least one detection region.

32. The detector device according to claim 31, wherein the non-sensing state of the two adjacent taps of the plurality of adjacent taps is obtained by disconnecting control regions of the two adjacent taps.

33. The detector device according to claim 31, wherein the non-sensing state of the two adjacent taps of the plurality of adjacent taps is obtained by connecting control regions of the two adjacent taps to a predetermined voltage, the predetermined voltage being lower than a voltage used in a sensing state.

34. The detector device of claim 31, wherein the non-sensing state of the two adjacent taps of the plurality of adjacent taps is obtained by modifying a polarity of the first majority carrier current between said two adjacent taps.

35. The detector device according to claim 30, wherein the control circuitry is further arranged for achieving pixel binning.

36. The detector device according to claim 27, wherein the at least one isolation region comprises a trench covered with an insulator and then filled with a conductive or semiconductor material.

37. The detector device according to claim 27, further comprising at least one further trench isolation region formed in the back side of the semiconductor layer.

38. The detector device according to claim 27, further comprising processing circuitry arranged for sampling a value related to minority carrier charges collected by the at least one detection region and for processing said value and outputting Time-Of-Flight data.

39. The detector device according to claim 27, further comprising optical filters on the front side or the back side of the semiconductor layer.

40. A detector device assisted by a majority current for detecting electromagnetic radiation, the detector device comprising:
  a semiconductor layer doped with a dopant of a first conductivity type, the semiconductor layer arranged so that the electromagnetic radiation enters the semiconductor layer and generates therein pairs of majority and minority carriers;
  at least two control regions formed in the semiconductor layer, the at least two control regions being doped with a dopant of the first conductivity type;
  a first source for generating at least one first majority carrier current in the semiconductor layer between the at least two control regions, the at least one first majority carrier current being associated with at least one first electrical field;
  at least one detection region formed in the semiconductor layer and being doped with a dopant of a second conductivity type different than the first conductivity type, the at least one detection region forming a junction in the semiconductor layer and collecting generated minority carriers, the minority carriers being directed towards the detection region under the influence of the at least one first electrical field;
  at least one isolation region formed in the semiconductor layer and located between the at least two control regions, the isolation regions deflecting the at least one first majority carrier current generated by the first source between the at least two control regions,
  wherein the at least one isolation region, is formed in a front side of the semiconductor layer or both in the front side and in a backside of the semiconductor layer and comprises Deep Trench Isolation regions and/or Ultra Deep Trench Isolation regions,
  wherein the front side of the semiconductor layer opposes the back side of the semiconductor layer and wherein the front side of the semiconductor layer comprises circuitry coupled to the semiconductor layer.

41. The detector device according to claim 40, wherein the at least one isolation region comprises at least one trench isolation region.

42. The detector device according to claim 40, further comprising a passivation layer formed on the back side of the semiconductor layer and being doped with a dopant of the first conductivity type, the passivation layer being contacted using a deep well formed in the front side of the semiconductor layer.

43. The detector device according to claim 40, further comprising a plurality of adjacent taps, each respectively associated with a one of the at least one isolation region located therebetween for deflecting the at least one first majority carrier current, each tap of the plurality of adjacent taps comprising at least one of the at least one detection regions and at least one of the at least one control regions; and
  further comprising control circuitry arranged for controlling the first source and controlling separately the at least one first majority carrier current deflected by the one of the at least one isolation region.

44. The detector device of claim 43, wherein the control circuitry is further arranged to put two adjacent taps of the plurality of adjacent taps in a non-sensing state by modifying a first majority carrier current of the at least one first majority carrier current to allow re-direction of generated minority carriers to a closest sensing detection region of the at least one detection region.

45. The detector device according to claim 44, wherein the non-sensing state of the two adjacent taps of the plurality of adjacent taps is obtained by disconnecting control regions of the two adjacent taps.

46. The detector device according to claim 44, wherein the non-sensing state of the two adjacent taps of the plurality of adjacent taps is obtained by connecting control regions of the two adjacent taps to a predetermined voltage, the predetermined voltage being lower than a voltage used in a sensing state.

47. The detector device of claim 44, wherein the non-sensing state of the two adjacent taps of the plurality of adjacent taps is obtained by modifying a polarity of the first majority carrier current between said two adjacent taps.

48. The detector device according to claim 43, wherein the control circuitry is further arranged for achieving pixel binning.

49. The detector device according to claim 40, wherein the at least one isolation region comprises a trench covered with an insulator and then filled with a conductive or semiconductor material.

50. The detector device according to claim 40, further comprising at least one further trench isolation region formed in the back side of the semiconductor layer.

51. The detector device according to claim 40, further comprising processing circuitry arranged for sampling a value related to minority carrier charges collected by the at least one detection region and for processing said value and outputting Time-Of-Flight data.

52. The detector device according to claim 40, further comprising optical filters on the front side or the back side of the semiconductor layer.

* * * * *